(12) United States Patent
Rokni et al.

(10) Patent No.: US 6,539,042 B2
(45) Date of Patent: Mar. 25, 2003

(54) ULTRA PURE COMPONENT PURGE SYSTEM FOR GAS DISCHARGE LASER

(75) Inventors: Shahryar Rokni, Carlsbad; Xiaojiang J. Pan, San Diego; Eckehard D. Onkels, San Diego, all of CA (US)

(73) Assignee: Cymer, Inc., San Diego, CA (US)

( * ) Notice: Subject to any disclaimer, the term of this patent is extended or adjusted under 35 U.S.C. 154(b) by 164 days.

(21) Appl. No.: 09/771,789

(22) Filed: Jan. 29, 2001

(65) Prior Publication Data

US 2002/0105996 A1 Aug. 8, 2002

Related U.S. Application Data

(63) Continuation-in-part of application No. 09/451,407, filed on Nov. 30, 1999.

(51) Int. Cl.[7] .................................................. H01S 3/22
(52) U.S. Cl. ........................... 372/59; 372/57; 372/58; 372/60
(58) Field of Search ..................................... 372/57–61

(56) References Cited

U.S. PATENT DOCUMENTS

| | | | |
|---|---|---|---|
| 3,845,409 A | 10/1974 | Wada et al. | 331/94.5 |
| 4,977,563 A | 12/1990 | Nakatani et al. | 372/32 |
| 5,095,492 A | 3/1992 | Sandstrom | 372/102 |
| 5,463,650 A | * 10/1995 | Ito et al. | 372/57 |
| 6,151,350 A | * 11/2000 | Komori et al. | 372/57 |
| 6,240,117 B1 | * 5/2001 | Gong et al. | 372/57 |

FOREIGN PATENT DOCUMENTS

| | | | |
|---|---|---|---|
| JP | 04-314374 | 11/1992 | 3/136 |
| JP | 05-167172 | 7/1993 | 3/137 |
| JP | 2631607 | 7/1997 | 3/38 |
| JP | 2696285 | 9/1997 | 3/137 |

OTHER PUBLICATIONS

Alvarez, Jr., Dan et al., "Exposure of Inert Gas Purifiers to Air—Studies of Hydrocarbon Release in Resin–Based vs. Nickel–Based Purifiers", Journal of the IEST, 41(6):26–32 (Nov./Dec. 1998).

Press, William H. et al., "Numerical Recipes, The Art of Scientific Computing", Cambridge, University Press (1990), pp. 274–277, 289–293 and 312–321.

* cited by examiner

Primary Examiner—Hemang Sanghavi
(74) Attorney, Agent, or Firm—John Ross

(57) ABSTRACT

The present invention provides an ultra pure purge system for discharge lasers. The LNP, the output coupler, the wavemeter and selected high voltage components are contained in sealed chambers each having a purge inlet port and a purge outlet port. Purge gas such as $N_2$ is filtered and directed to each of the inlet ports. Gas exiting the outlet ports may be directed to flow monitors having alarms so that any loss of purge will be immediately detected. Purge gas may be exhausted or recirculated.

8 Claims, 3 Drawing Sheets

ULTRA PURE COMPONENT PURGE SYSTEM FOR GAS DISCHARGE LASER

This invention relates to lasers and in particular to high power gas discharge lasers with a grating based line narrowing unit. This invention is a continuation-in-part of Ser. No. 09/451,407, filed Nov. 30, 1999.

BACKGROUND OF THE INVENTION

Narrow Band Gas Discharge Lasers

Gas discharge ultraviolet lasers used a light source for integrated circuit lithography typically are line narrowed. A preferred line narrowing prior art technique is to use a grating based line narrowing unit, called a line narrowing package or "LNP", along with an output coupler to form the laser resonance cavity. These systems also include a wavemeter in which laser pulse energy and wavelength are measured. The gain medium within this cavity is produced by electrical discharges (produced by a pulse power system) into a circulating laser gas such as krypton, fluorine and neon (for a KrF laser); argon, fluorine and neon (for an ArF laser); or fluorine and helium and/or neon (for an $F_2$ laser). Discharges in these lasers are produced by high voltage pulses with peak voltages in the range of between about 15,000 volts to 30,000 volts. A typical prior art excimer laser is described in U.S. Pat. No. 6,128,323 which is incorporated herein by reference.

It is known to provide nitrogen purges to selected optical and high voltage components of these laser systems. The optical components including the LNP, the output coupler and the wavemeter are purged primarily to prevent damage to the optical components caused by the interaction of oxygen or other airborne contaminants with the components in the presence of ultraviolet radiation. High voltage components are purged to prevent flashovers which can occur in the presence of air, especially air containing contaminants. The purged high voltage components include (1) a high voltage cable connecting the portion of the pulse power system called the commutator to another portion called the compression head and (2) the high voltage components mounted on top of the laser chamber which includes a bank of capacitors which accumulate the discharge pulse energy and the additional electrical components within the compression head all of which operate at voltages in excess of about 15,000 volts at the electrical peak of each pulse. These purge systems are important for KrF lasers which produce a laser beam at a wavelength about 248 nm but they are even more important for ArF lasers and $F_2$ lasers which produce much more energetic beams and operate at higher discharge voltages.

The $N_2$ purge systems typically used in prior art excimer laser systems consists of an $N_2$ line which directs flowing purge gas to a chamber containing the components being purged. The $N_2$ merely floods the chamber and exits through miscellaneous openings. Only in particular circumstances is it normal practice even to provide a specific outlet port and when an outlet port is provided, the chamber is typically not sealed so that the $N_2$ may exit various miscellaneous openings.

There are two major problems with these prior art systems. First, contaminated air may infiltrate into the purged chambers through one or more of the miscellaneous openings with adverse effects. Second, occasionally the $N_2$ supply (either the source itself or the supply lines) may contain contaminants which could (and in fact has) resulted in damage to the purged components.

The present invention provides a solution to these prior art problems.

SUMMARY OF THE INVENTION

The present invention provides an ultra pure purge system for discharge lasers. The LNP, the output coupler, the wavemeter and selected high voltage components are contained in sealed chambers each having a purge inlet port and a purge outlet port. Purge gas such as $N_2$ is filtered and directed to each of the inlet ports. Gas exiting the outlet ports may be directed to flow monitors having alarms so that any loss of purge will be immediately detected. Purge gas may be exhausted or recirculated.

DETAILED DESCRIPTION OF PREFERRED EMBODIMENTS

Preferred embodiments of the present invention may be described by reference to the drawings.

First Preferred Embodiment

Figure 1:
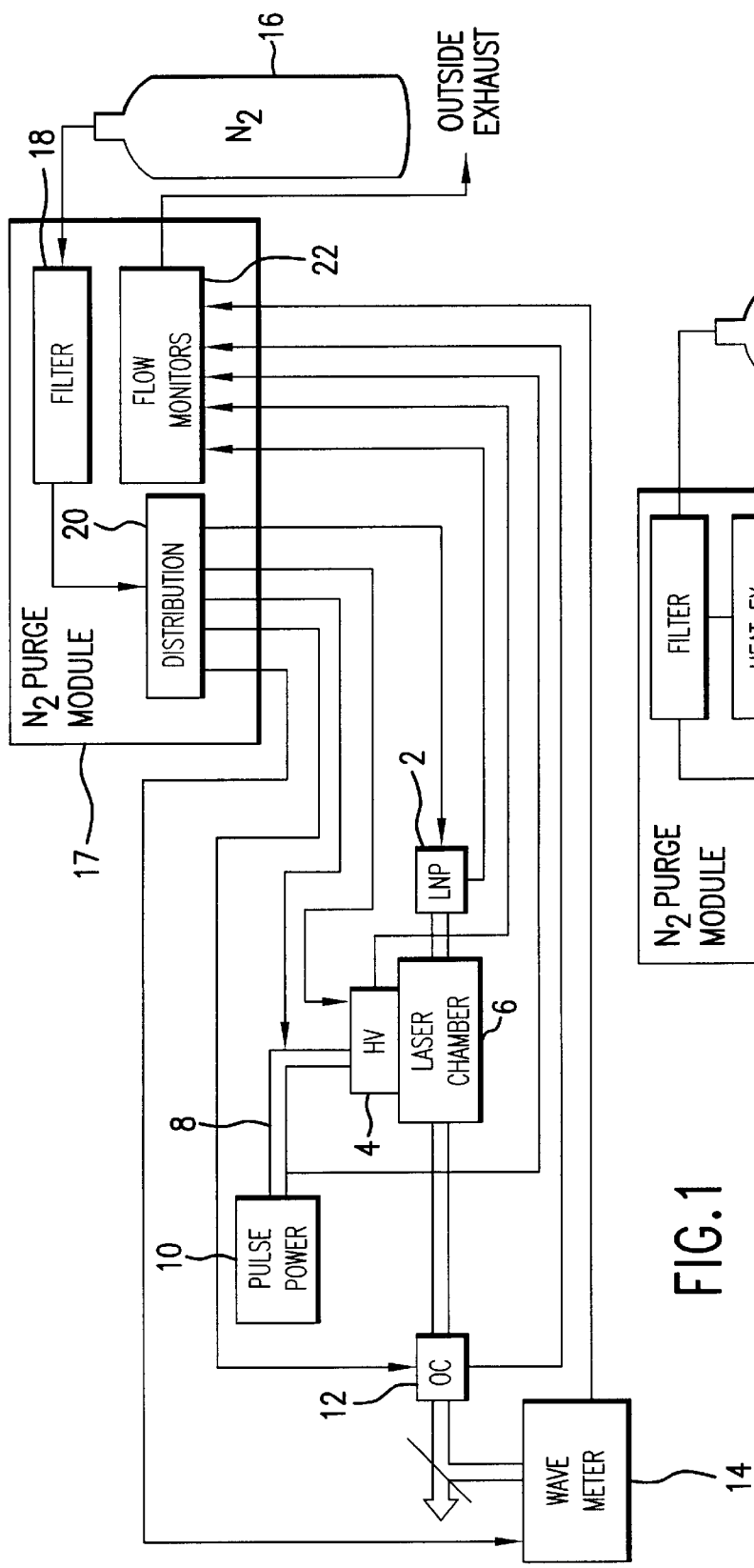
FIG.1 is lock diagram of a preferred embodiment of the present invention.

FIG. 1 is a block diagram showing important features of a first preferred embodiment the present invention. Five excimer laser components which are purged by nitrogen gas in this embodiment of the present system are LNP 2, high voltage components 4 mounted on laser chamber 6, high voltage cable 8 connecting the high voltage components 4 with upstream pulse power components 10, output coupler 12 and wavemeter 14. Each of the components 2, 4, 8, 12, and 14 are contained in sealed containers or chambers each having only two ports an $N_2$ inlet port and an $N_2$ outlet port. An $N_2$ source 16 which typically is a large $N_2$ tank (typically maintained at liquid nitrogen temperatures) at a integrated circuit fabrication plant but may be a relatively small bottle of $N_2$. $N_2$ source gas exits $N_2$ source 16, passes into $N_2$ purge module 17 and through $N_2$ filter 18 to distribution panel 20 containing flow control valves for controlling the $N_2$ flow to the purged components. With respect to each component the purge flow is directed back to the module 17 to a flow monitor unit 22 where the flow returning from each of the purge units is monitored and in case the flow monitored is less than a predetermined value an alarm (not shown) is activated.

Figure 2:
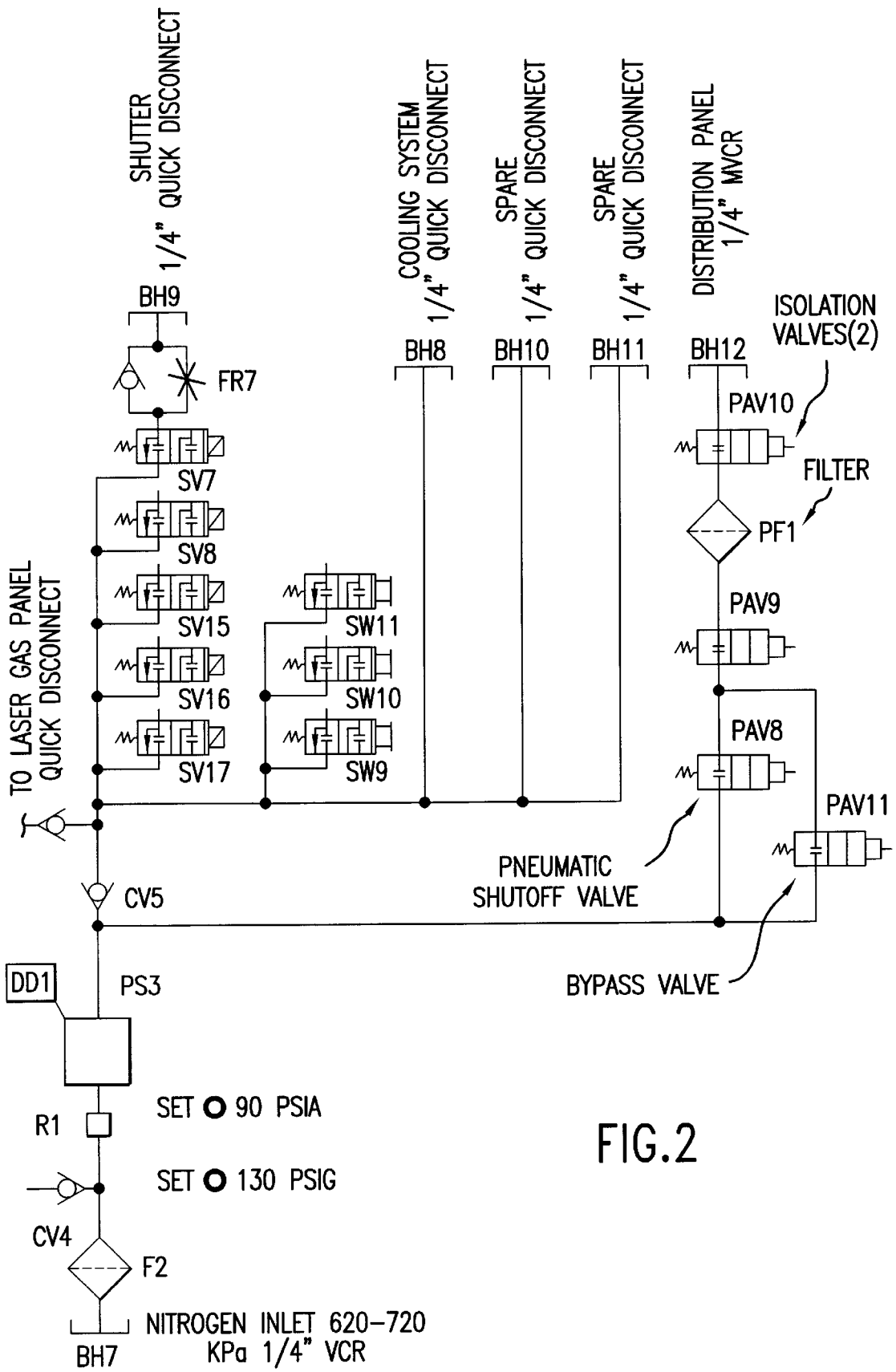
FIG. 2 is a line diagram showing components of the preferred embodiment.
Figure 3:
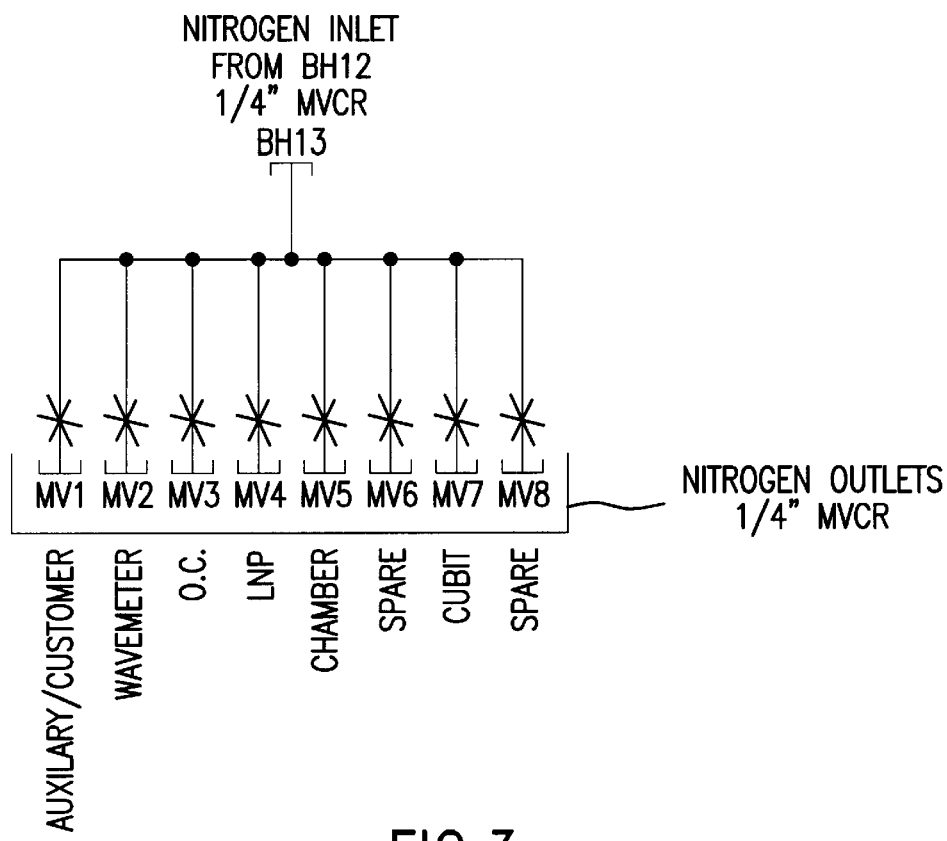
FIG. 3 is a line diagram showing elements of a distribution panel.
Figure 4:
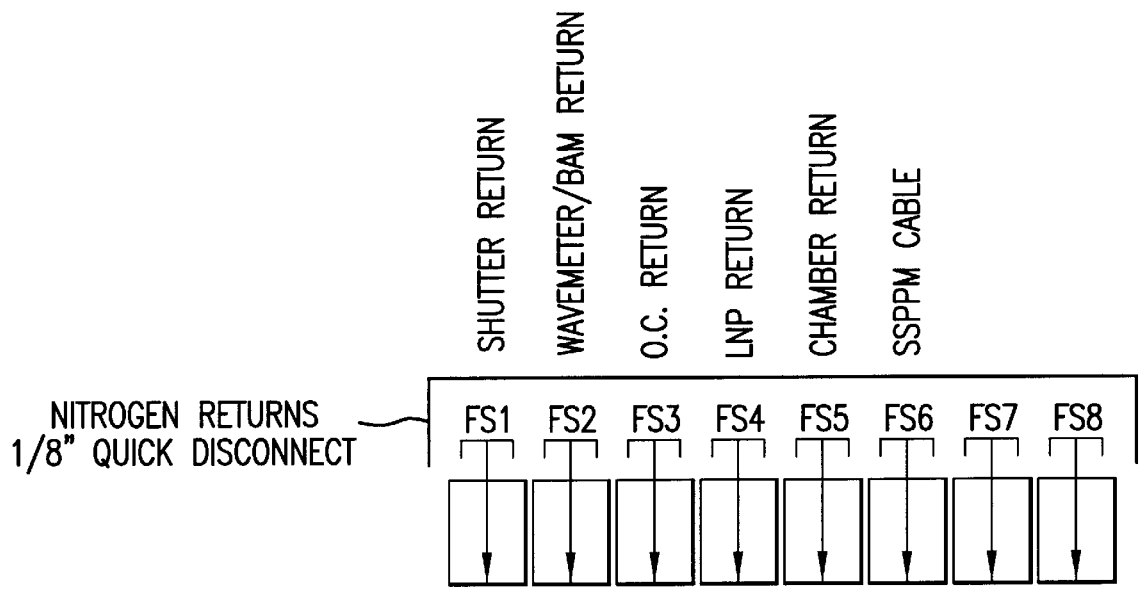
FIG. 4 is a line diagram showing elements of a flow monitor unit.

FIG. 2 is a line diagram showing specific components of this preferred embodiment including some additional $N_2$ features not specifically related to the purge features of the present invention. FIG. 3 is a line diagram showing the elements of the distribution panel 20 and FIG. 4 is a line drawing showing features of the flow monitoring unit 22.

$N_2$ Filter

An important feature of the present invention is the inclusion of $N_2$ filter 18. In the past, makers of excimer lasers for integrated circuit lithography have believed that a filter for $N_2$ purge gas was not necessary since $N_2$ gas specification for commercially available $N_2$ is almost always good enough so that gas meeting specifications is clean enough. Applicants have discovered, however, that occasionally the source gas may be out of specification on the $N_2$ lines leading to the purge system may contain contamination. Also lines can become contaminated during maintenance or operation procedures. Applicants have determined that the cost of the filter is very good insurance against an even low probability of contamination caused by optics damage or high voltage flashover damage.

A preferred $N_2$ filter is Model 500K Inert Gas Purifier available from Aeronex, Inc. with offices in San Diego, Calif. This filter removes $H_2O$, $O_2$, CO, $CO_2$, $H_2$ and non-methane hydrocarbons to sub parts per billion levels. It removes 99.9999999 percent of all particulate 0.003 microns or larger.

Flow Monitors

A flow monitor in unit 22 is provided for each of the five purged components. These are commercially available units having an alarm feature for low flow.

Piping

Preferably all piping is comprised of stainless steel (316SST) with electro polished interior.

Recirculation

Figure 5:
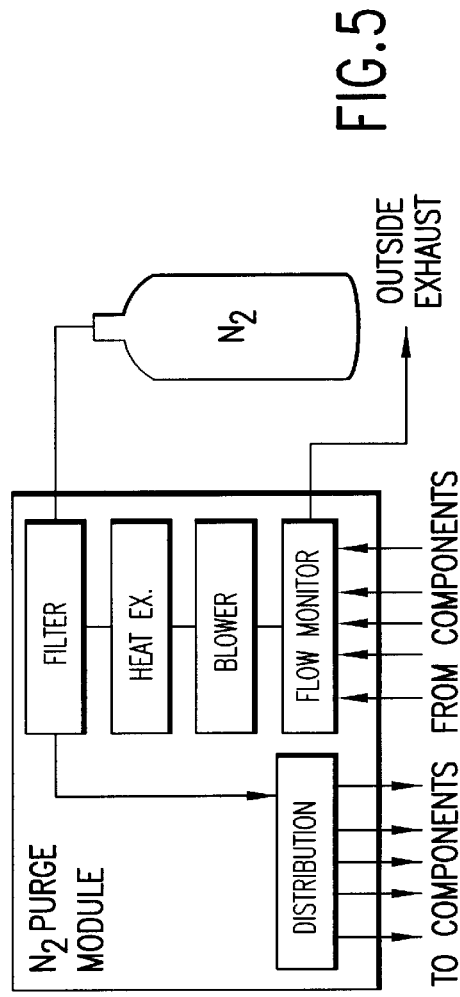
FIG. 5 shows how the purge gas could be recirculated.

A portion or all of the purge gas could be recirculated as shown in FIG. 5. In this case, a blower and a water cooled heat exchanger is added to the purge module. For example, purge flow from the optical components could be recirculated and purge flow from the electrical components could be exhausted or a portion of the combined flow could be exhausted.

Advantages of the System

The system described herein represents a major improvement in long term excimer laser performance especially for ArF and F2 lasers. Contamination problems are basically eliminated which has resulted in substantial increases in component lifetimes and beam quality. In addition, since leakage has been eliminated except through outlet ports the flow can be controlled to desired values which has the effect of reducing N2 requirements by about 50 percent.

The reader should recognize that the above embodiment of this invention is provided as an example and many other embodiments of the present invention are possible. For example, additional components could be added to as purged components. For example, optical test equipment could be purged using the system. Purge gases other than $N_2$ could be used. Other possibilities include argon, helium, neon or krypton. Therefore, preferably several spare purge and monitor elements would be included in the system when it is initially fabricated. Therefore, the scope of the present invention should be determined by the appended claims and their legal equivalents.

We claim:

1. An ultra pure purge system for a gas discharge laser comprising:
   A) a gas discharge laser comprising:
      1) high voltage components mounted on a laser chamber and contained in a sealed high voltage chamber having a purged outlet port and a purge outlet port;
      2) line narrowing components for narrowing bandwidth of laser beams produced by said laser contained in a sealed line narrowing chamber having a purge inlet port and a purge outlet port;
      3) an output coupler contained in a sealed output coupler chamber having a purge inlet port and a purge outlet port;
      4) a wavemeter contained in a sealed wave meter chamber having a purge inlet port and a purge outlet port
   B) a purge gas source;
   C) a component purge system comprising:
      1) a purge gas filter for filtering purge gas from said purge gas source;
      2) a distribution system comprising purge lines for directing filtered gas from said purge gas filter to the inlet port of each of said high voltage chamber, said line narrowing chamber, said output coupler chamber and said wavemeter chamber;
      3) a flow monitor system compromising at least three flow monitors and a flow collection system comprising purge collection lines for directing gas exiting at the exit port of each of said line narrowing chamber, said output coupler chamber and said wavemeter chamber to one of said at least three flow monitors.

2. A purge system as in claim 1 and further comprising a high voltage cable at least a portion of which is contained in a sealed cable chamber having a purge gas inlet port and a purge gas outlet port wherein said distribution system also comprises a purge line for directing purge gas to said inlet port of said sealed cable chamber and said flow collection system also comprises a purge collection line for directing purge gas from said exit port of said cable chamber to a flow monitor.

3. A purge system as in claim 1 wherein said purge gas comprises nitrogen.

4. A purge system as in claim 1 wherein said purge gas comprises helium.

5. A purge gas system as in claim 1 and further comprising a means for recirculating a portion or all of said purge gas directed to said flow monitors.

6. A purge system as in claim 1 wherein all of said purge lines and all of said collection lines are comprised of stainless steel.

7. A purge system as in claim 1 wherein said flow collection system also comprises a purge collection line for directing purge gas from said exit port of said sealed high voltage chamber to a flow monitor.

8. A purge system as in claim 1 and further comprising a means for recirculating a portion or all of said purge gas.

* * * * *

UNITED STATES PATENT AND TRADEMARK OFFICE
CERTIFICATE OF CORRECTION

PATENT NO.   : 6,539,042 B2                                                                Page 1 of 1
DATED        : March 25, 2003
INVENTOR(S)  : Shabryar Rokni et al.

It is certified that error appears in the above-identified patent and that said Letters Patent is hereby corrected as shown below:

<u>Column 4,</u>
Line 7, change "purged outlet" to -- purge inlet --.

Signed and Sealed this

Sixteenth Day of August, 2005

JON W. DUDAS
*Director of the United States Patent and Trademark Office*